United States Patent
Wallace et al.

(10) Patent No.: US 6,291,867 B1
(45) Date of Patent: Sep. 18, 2001

(54) ZIRCONIUM AND/OR HAFNIUM SILICON-OXYNITRIDE GATE DIELECTRIC

(75) Inventors: Robert M. Wallace, Richardson; Richard A. Stoltz, Plano; Glen D. Wilk, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/434,205

(22) Filed: Nov. 4, 1999

Related U.S. Application Data

(62) Division of application No. 09/115,859, filed on Jul. 15, 1998, now Pat. No. 6,020,243.
(60) Provisional application No. 60/053,616, filed on Jul. 24, 1997, and provisional application No. 60/053,617, filed on Jul. 24, 1997.

(51) Int. Cl.[7] .................. H01L 29/76; H01L 29/94; H01L 31/062; H01L 31/113; H01L 31/119

(52) U.S. Cl. .................. 257/410; 257/411; 257/310; 257/324

(58) Field of Search .................. 257/310, 324, 257/368, 410, 411

(56) References Cited

U.S. PATENT DOCUMENTS

| | | |
|---|---|---|
| 3,895,966 | 7/1975 | MacDougall et al. . |
| 4,977,440 * | 12/1990 | Stevens .................. 257/751 |
| 5,098,623 | 3/1992 | Pompe . |
| 5,173,835 | 12/1992 | Cornett et al. . |
| 5,187,636 | 2/1993 | Nakao . |
| 5,464,683 * | 11/1995 | Rudigier et al. .................. 428/216 |
| 5,504,041 | 4/1996 | Summerfelt . |
| 5,528,068 | 6/1996 | Ohmi . |

(List continued on next page.)

FOREIGN PATENT DOCUMENTS

| | | |
|---|---|---|
| 4-305836-A * | 10/1992 | (JP) . |
| 5-305721-A * | 11/1993 | (JP) . |

OTHER PUBLICATIONS

L. Manchanda et al., "Gate Quality Doped High K Films for CMOS Beyond 100 nm: 3–10 nm Al/sub 3/ with Low Leakage and Low Interface States," IEEE Electron Devices Meeting, IEDM '98 Technical Digest, Dec. 9, 1998, pp. 605–608.

H. Shimada et al., "Current Drive Enhancement by Using High–Permittivity Gate Insulator in SOI MOSFET's and its Limitation," IEEE Transactions on Electron Devices, vol. 43, No. 3, Mar. 1996, pp. 431–435.

H. Shimada et al., "Mimimum Parasitic Resistance for Ultra–Thin SOI MOSFET with High–Permittivity Gate Insulator Performed by Lateral Contact Structure," Proceedings 1995 IEEE International SOI Conference, Oct. 1995, pp. 98–99.

(List continued on next page.)

*Primary Examiner*—Carl Whitehead, Jr.
*Assistant Examiner*—Jamie L. Brophy
(74) *Attorney, Agent, or Firm*—David Denker; Wade James Brady, III; Frederick J. Telecky, Jr.

(57) ABSTRACT

A field effect semiconductor device comprising a high permittivity zirconium (or hafnium) silicon-oxynitride gate dielectric and a method of forming the same are disclosed herein. The device comprises a silicon substrate 20 having a semiconducting channel region 24 formed therein. A zirconium silicon-oxynitride gate dielectric layer 36 is formed over this substrate, followed by a conductive gate 38. Zirconium silicon-oxynitride gate dielectric layer 36 has a dielectric constant is significantly higher than the dielectric constant of silicon dioxide. However, the zirconium silicon-oxynitride gate dielectric may also be designed to have the advantages of silicon dioxide, e.g. high breakdown, low interface state density, and high stability.

16 Claims, 3 Drawing Sheets

U.S. PATENT DOCUMENTS

| | | |
|---|---|---|
| 5,621,681 | 4/1997 | Moon . |
| 5,736,267 * | 4/1998 | Mitsui et al. ............... 428/702 |
| 5,773,325 | 6/1998 | Teramoto . |
| 5,786,078 * | 7/1998 | Sekiya et al. ............... 428/332 |
| 5,834,353 | 11/1998 | Wu . |
| 5,851,896 | 12/1998 | Summerfelt . |
| 5,874,766 | 2/1999 | Hori . |
| 5,876,788 | 3/1999 | Bronner et al. . |
| 5,880,006 | 3/1999 | Lin et al. . |
| 5,880,508 | 3/1999 | Wu . |
| 5,922,478 * | 7/1999 | Welty et al. ............... 428/621 |
| 5,923,056 | 7/1999 | Lee et al. . |
| 5,980,977 * | 11/1999 | Deng et al. ............... 427/79 |
| 6,013,553 | 1/2000 | Wallace et al. . |
| 6,020,243 | 2/2000 | Wallace et al. . |
| 6,096,590 * | 8/2000 | Chan et al. ............... 438/233 |
| 6,183,846 * | 2/2001 | Moriguchi et al. ............ 428/216 |

OTHER PUBLICATIONS

A. Chatterjee et al., "CMOS Metal Replacement Gate Transistors Using Tantalum Pentoxide Gate Insulator," IEEE Electron Devices Meeting, IEDM '98 Technical Digest, Dec. 9, 1998, pp. 777–780. (Abstract).

Yongjoo Jeon et al., "Effect of Barrier Layer on the Electrical and Reliability Characteristics of High–K Gate Dielectric Films," IEEE Electron Devices Meeting, IEDM '98 Technical Digest, Dec. 9, 1998, pp. 797–800.

Hsing–Huang Tseng et al., "Reduced Gate Leakage Current and Boron Penetration of 0.18 um 1.5 V MOSFETs Using Integrated RTCVD Oxynitride Gate Dielectric," IEEE Electron Devices Meeting IEDM '98 Technical Digest, Dec. 9, 1998, pp. 793–796.

C. T. Liu, "Circuit Requirement and Integration Challenges of Thin Gate Dielectrics for Ultra Small MOSFETs," IEEE Electron Devices Meeting, IEDM '98 Technical Digest, Dec. 9, 1998, pp. 747–750.

* cited by examiner

US 6,291,867 B1

ZIRCONIUM AND/OR HAFNIUM SILICON-OXYNITRIDE GATE DIELECTRIC

This application is a divisional of application Ser. No. 09/115,859 filed Jul. 15, 1998, now U.S. Pat. No. 6,020,243, which claims priority from U.S. Provisional application Nos. 60/053,616 filed Jul. 24, 1997 and 60/053,617 filed Jul. 24, 1997.

FIELD OF THE INVENTION

This invention relates generally to semiconductor device structures and methods for forming such, and more specifically to such structures and methods related to gate dielectrics for field effect devices formed on integrated circuits.

BACKGROUND OF THE INVENTION

Semiconductor devices such as field effect transistors are common in the electronics industry. Such devices may be formed with extremely small dimensions, such that thousands or even millions of these devices may be formed on a single-crystal silicon substrate or "chip" and interconnected to perform useful functions in an integrated circuit such as a microprocessor.

Although transistor design and fabrication is a highly complex undertaking, the general structure and operation of a transistor are fairly simple. With reference to FIG. 1, a simplified field effect transistor is shown in cross-section. In a field effect transistor a portion of the substrate (or epilayer) 100 near the surface is designated as the channel 120 during processing. Channel 120 is electrically connected to source 140 and drain 160, such that when a voltage difference exists between source 140 and drain 160, current will tend to flow through channel 120. The semiconducting characteristics of channel 120 are altered such that its resistivity may be controlled by the voltage applied to gate 190, a conductive layer overlying channel 120. Thus by changing the voltage on gate 190, more or less current can be made to flow through channel 120. Gate 190 and channel 120 are separated by gate dielectric 180; the gate dielectric is insulating, such that between gate 190 and channel 120 little or no current flows during operation (although "tunneling" current is observed with thin dielectrics). However, the gate dielectric allows the gate voltage to induce an electric field in channel 120, giving rise to the name "field effect transistor."

Generally, integrated circuit performance and density may be enhanced by "scaling", that is by decreasing the size of the individual semiconductor devices on a chip. Unfortunately, field effect semiconductor devices produce an output signal that is proportional to the length of the channel, such that scaling reduces their output. This effect has generally been compensated for by decreasing the thickness of gate dielectric 180, thus bringing the gate in closer proximity to the channel and enhancing the field effect.

As devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally from a few layers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities. Realizing the limitations of silicon dioxide, researchers have searched for alternative dielectric materials which can be formed in a thicker layer than silicon dioxide and yet still produce the same field effect performance. This performance is often expressed as "equivalent oxide thickness": although the alternative material layer may be thick, it has the equivalent effect of a much thinner layer of silicon dioxide (commonly called simply "oxide"). Many, if not most, of the attractive alternatives for achieving low equivalent oxide thicknesses are metal oxides, such as tantalum pentoxide, titanium dioxide, and barium strontium titanate.

Researchers have found formation of such metal oxides as gate dielectrics to be problematic. At typical metal oxide deposition temperatures, the oxygen ambient or oxygen-containing precursor required to form them tends to also oxidize the silicon substrate, producing an oxide layer at the interface between the substrate and the gate dielectric. The presence of this interfacial oxide layer increases the effective oxide thickness, reducing the effectiveness of the alternative gate dielectric approach. The existence of the interfacial oxide layer places an ultimate constraint on the performance of an alternative dielectric field effect device.

SUMMARY OF THE INVENTION

The present invention includes a semiconductor device structure utilizing a metal silicon-oxynitride gate dielectric layer, and a method for making the same. In this method, the metal is selected from the group of hafnium, zirconium, and mixtures thereof. With the present invention, a zirconium (or hafnium) silicon-oxynitride gate dielectric may be formed with a dielectric constant substantially higher than that of either conventional thermal silicon dioxide or silicon nitride dielectrics. Thus, the metal silicon-oxynitride dielectric layer may be made substantially thicker than a conventional gate dielectric with equivalent field effect. Additionally, the presence of nitrogen, in at least a partial thickness of the gate dielectric, helps to prevent the diffusion of boron, such as from a boron-doped polysilicon gate electrode, to the channel region. However, it is believed that the present invention largely avoids disadvantages, such as interfacial silicon dioxide formation and high interface state densities, which are found with previously considered alternative dielectrics.

The present invention generally avoids the problems of other alternative dielectrics by employing an oxidized dielectric material comprising a significant amount of silicon, particularly at the silicon/dielectric interface. In one embodiment, a graded zirconium silicon-oxynitride layer is formed, such that near the silicon interface the dielectric layer has a large $SiO_2$ component, while the upper portion of the dielectric layer has a large zirconium oxynitride component. Such a structure employs primarily $Si/SiO_2$ bonding at the silicon interface, with resulting low interface state densities. However, the zirconium and/or hafnium included in the dielectric layer can significantly increase the dielectric constant of the film. The present invention also provides for amorphous gate dielectrics, which have dense microstructures and avoid many of the problems associated with grain boundaries in polycrystalline dielectrics.

We have taken this approach in spite of the conventional researcher wisdom to avoid nitrogen-based compounds for gate dielectrics. Additionally, integrated circuit manufacturing researchers tend to hesitate before investigating the addition of new materials, and especially material types, for mass produced integrated circuits. In spite of this, our investigations suggest that zirconium silicon-oxynitride and hafnium silicon-oxynitride (with relatively small N levels) are stable next to Si, so there will not be a reaction to form $SiO_2$ (silicon oxide reactions are at least minimized to the extent that the dielectric properties are not substantially corrupted). Combining this, the $SiO_2$-like interface possibilities and the high permittivities achievable, with our research into understanding the silicon/oxynitride interface has allowed us to recognize the usability of zirconium silicon-oxynitride and hafnium silicon-oxynitride gate dielectrics.

In one aspect of the invention, a method of fabricating a semiconductor device is disclosed that includes providing a single-crystal silicon substrate, which usually includes structures, such as a channel region, forming a metal silicon-oxynitride gate dielectric layer on the substrate, and forming a conductive gate overlying the gate dielectric layer. This metal can be zirconium, hafnium, or a mixture of the two.

In one zirconium-based approach, the zirconium silicon-oxynitride dielectric layer step is formed by forming a zirconium silicide on the substrate, annealing the formed metal silicide in an atmosphere including oxygen and nitrogen, thus forming a metal silicon-oxynitride layer on the substrate. Preferably, the atmosphere includes NO, but may be a remote nitrogen/oxygen plasma. In some embodiments, the annealing time is limited, such that the nitrogen to silicon ratio of the metal silicon-oxynitride layer is lower near the interface with the silicon substrate than near the interface with the conductive gate.

In some embodiments, the zirconium silicide step is formed by depositing a zirconium layer on the substrate in an inert atmosphere, and annealing the substrate and Zr layer in an inert atmosphere to form a zirconium silicide layer.

In another zirconium-based approach, the zirconium silicon-oxynitride dielectric layer is formed by forming a zirconium silicide on the substrate, annealing the formed metal silicide in a non-oxidizing atmosphere including nitrogen, such as atomic nitrogen or $NH_3$, and annealing the metal silicon-nitride layer in an oxidzing ambient, thereby forming a metal silicon-oxynitride layer on the substrate.

In another method of forming a hafnium silicon-oxynitride dielectric layer, the method includes depositing a hafnium silicide on the substrate in an atmosphere including oxygen and nitrogen, thereby forming a hafnium silicon-oxynitride layer on the substrate.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

Figure 1:
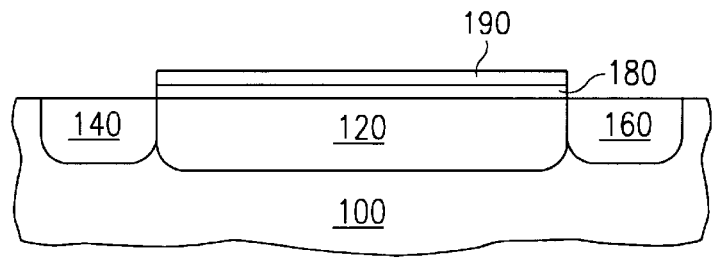
FIG. 1 is a cross-sectional view of a typical prior art integrated circuit field effect transistor.

This application describes the embodiments in terms of a zirconium silicon-oxynitride dielectric. However, due to its chemical similarity, hafnium can be used in place of zirconium in most of these embodiments. Additionally, hafnium-zirconium mixtures can be used in place of either. In some embodiments, these mixtures will be substantially pure Zr or Hf, with only small amounts of Hf or Zr included. In general, both zirconium silicon-oxynitride and hafnium silicon-oxynitride provide high dielectric constants and good chemical stability. In some embodiments, Zr will be preferred due to its higher availability and lower cost. However, hafnium silicon-oxynitride has a somewhat higher dielectric constant and may be more stable than zirconium silicon-oxynitride. This slight performance edge may lead to a preference for hafnium silicon-oxynitride in some applications.

The preferred embodiments of the invention may be fabricated on a silicon substrate, as described herein. Although it is not required to practice this invention, it is conventional to use a Si(100) substrate. The description of these embodiments begins, as shown if FIG. 2, after formation of an optional epitaxial Si layer 22 on substrate 20 and implantation of an active channel region 24 in epitaxial layer 22 (or substrate 20, if no epi-layer is used). The description assumes that a protective or native silicon oxide region 26 (preferably comprising less than 1 nm of oxide) overlies channel 24 in the region of interest. Such a silicon oxide layer may be formed by heating a clean substrate to 600–700° C. for approximately 30 seconds, in an oxygen ambient of ~$10^{-3}$ Torr. Processes for reaching this step in fabrication are all well-known in the art, as are various equivalents to which the present invention is applicable.

The particular embodiment employed for forming a zirconium silicon-oxynitride gate dielectric will dictate whether silicon oxide region 26 will be either left in place and used in the formation of the zirconium silicon-oxynitride layer, removed such that the underlying silicon may be used in the formation of the dielectric layer, or removed and replaced with a passivation layer designed to inhibit interaction of the substrate in the zirconium silicon-oxynitride deposition process.

Figure 3:
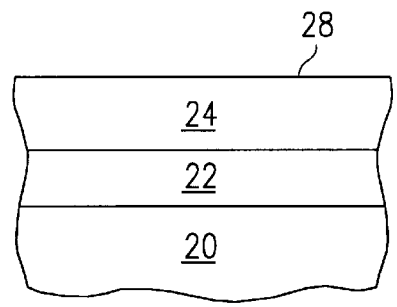
Figure 4:
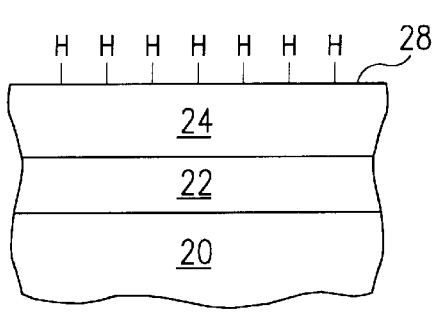

The immediately following description relates to the preparation of the substrate for deposition of silicon-oxynitride-forming materials, and is applicable to the specific embodiments presented thereafter. There are two preferred starting surfaces for the invention if silicon oxide region 26 is to be removed. Region 26 may be removed so as to leave either a clean, bare upper surface 28 as shown in FIG. 3, or a hydrogen-terminated surface 28 as shown in FIG. 4. If oxide region 26 is removed, the bare surface is preferred to the hydrogen-terminated surface if chemical reaction of the highly reactive bare Si surface can be prevented, e.g., by processing in ultrahigh (less than ~$10^{-8}$ Torr) vacuum until a point in the particular process where exposure to oxygen can be tolerated. Otherwise, the bare Si surface should be terminated with a suitable passivant, such as hydrogen, which inhibits reoxidation, yet may be readily removed at an appropriate point in the process.

The method of oxide removal is not believed to be critical to the practice of the invention, as long as a clean, oxide-free surface 28 can be maintained until an overlying deposition is performed. One preferred method of performing removal of oxide 26 is by exposure to wet HF, for example by dipping the substrate in dilute HF for 30 seconds and rinsing in deionized water. This both removes the native oxide and hydrogen terminates the surface. Another preferred method is by exposure to HF vapor; this provides similar results, but may be used, e.g., in a cluster tool to further prevent reoxidation or contamination of the surface. Either of these approaches may include other appropriate stripping chemicals, with HF or a $NH_4F$ solution being preferred as a last step to provide termination.

Several other methods produce a non-terminated surface 28, as shown in FIG. 3. One such method with particular applicability to cluster-tool practice is Si flux desorption. It has been found that below $10^{-8}$ Torr and at 780° C., an Si flux of preferably 1.5 Å/sec for about 600 seconds not only removes native oxide, but produces an atomically smooth, stepped surface that may have advantages for ultrathin gate dielectrics. The alternative is simple desorption by heating of the substrate to high temperature in vacuum or in an $H_2$ ambient. It is believed, however, that the Si-flux method results in a superior surface structure. In any of these methods, if the substrate will not be kept in ultrahigh vacuum until an overlying deposition is completed, surface 28 may be hydrogen terminated, e.g. by exposure to atomic hydrogen produced by a plasma or hot filament in an $H_2$ ambient.

Surface 28 may also be passivated with an ultrathin layer, such as a silicon nitride or silicon oxynitride layer, that is not, strictly speaking, an oxide of silicon. Such layers act as a diffusion barrier and provide oxidation resistance to the substrate during formation of the overlying layer. If an oxynitride layer is used, the preferred method of oxynitridation is by exposure to NO. Oxynitrides produced by other methods are not believed to provide sufficient oxidation resistance at the required thicknesses to complete some of the gate dielectric structures disclosed herein, and/or require higher process temperatures, and as such are not preferred. For instance, $N_2O$ processes result in a much smaller incorporation of N than NO processes. $NH_3$ processes require a pre-existing $SiO_2$ film, and thus a uniform sub-nanometer oxynitride film appears to be difficult to achieve using $NH_3$. Additionally, $NH_3$ annealing apparently incorporates undesirable hydrogen into the film structure. A silicon nitride can be formed by using a remote nitrogen plasma.

Figure 5:
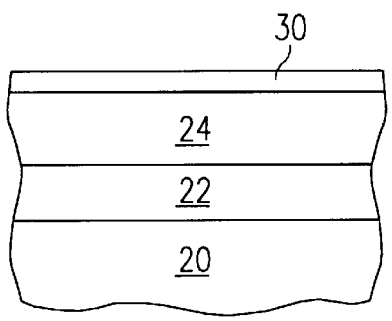

A typical NO process applicable to the present invention is as follows. The substrate is cleaned to remove the pad oxide. As a final step in the cleaning, the substrate is dipped in dilute HF for 30 seconds, and rinsed in deionized water. The substrate is then placed in a reaction chamber, which is then evacuated to $3\times10^{-8}$ Torr, and then the substrate is heated to 500° C. to remove the hydrogen passivation from the substrate surface. The substrate is heated to 700° C., and NO at 4 Torr is introduced into the chamber for 10 seconds to form the oxynitride passivation layer. FIG. 5 depicts a passivation layer 30, e.g., typically an oxynitride, but possibly a nitride passivation layer.

Once the substrate has been prepared to provide either a clean Si surface, an oxide layer, or a protective barrier layer as described above, a zirconium (or hafnium) silicon-oxynitride gate dielectric is formed on the substrate by one of several methods. Several of these methods are described below.

We chose zirconium silicon-oxynitride and hafnium silicon-oxynitride due to their stability next to silicon and higher permittivity. Based on the silicate and oxide data, we believe that these silicon-oxynitride's heat of formation is more negative than the heat of formation of silicon dioxide and that their permittivity is higher than either $SiO_2$ or silicon nitride. This should form a more stable gate structure and avoid the preferential formation of interfacial silicon dioxide. Table 1 lists the heat of formation, permittivity, and bandgap of several materials, with silicon dioxide included for comparison purposes.

TABLE 1

| Material | Bulk Permittivity | Bandgap (eV) | Heat of Formation (kcal/g/atom of O) |
|---|---|---|---|
| $Y_2O_3$ | 12 | | -152 |
| CaO | | 7 | -152 |
| MgO | 9.6 | 7.8 | -144 |
| $La_2O_3$ | 30 | | -143 |
| SrO | | 5.8 | -142 |
| $Ca_3SiO_5$ | | | -138 |
| $Sc_2O_3$ | | | -137 |
| $Ca_2SiO_4$ | | | -135 |
| $HfO_2$ | 40 | | -134 |
| $ZrO_2$ | 25 | 7.8 | -131 |
| $CeO_2$ | 26 | | -129 |
| $Al_2O_3$ | 10 | 8.7 | -125 |
| $Ba_2SiO_4$ | | | -124 |
| $CaSiO_3$ | | | -123 |
| $SrSiO_3$ | | | ~-123 |
| $Mg_2SiO_4$ | | | -122 |
| $Na_2SiO_3$ | | | -121 |
| $BaSiO_3$ | | | -120 |
| $MgSiO_3$ | | | -119 |
| $ZrSiO_4$ | | | -115 |
| $CeSiO_4$ | | | ~-115 |
| $Bi_4Si_2O_{12}$ | 35-75 | | |
| $TiO_2$ | 30 | 3-3.5 | -110 |
| $SiO_2$ | 3.9 | 8.9-9.3 | -103 |
| $Ta_2O_5$ | 26 | 4.5 | -100 |
| ZnO | 4.6 | 3.3 | -84 |
| $WO_3$ | 42 | | -66.9 |
| CuO | | | -37.6 |
| PdO | | | -21 |

The zirconium silicon-oxynitride may be formed as either a polycrystalline or an amorphous film. Generally, polycrystalline films will have a higher dielectric constant. However, amorphous films generally have higher breakdown performance, form a better diffusion barrier, and have lower interface state densities. Also, with many of the embodiments for formation of a zirconium silicon-oxynitride dielectric according to the present invention, formation of an amorphous film may be easier than formation of a polycrystalline film because of the uniform stoichiometry required for a polycrystalline film.

The present invention comprehends a graded dielectric composition. In one embodiment, a zirconium silicon-oxynitride film may be formed where the ratio of silicon to Zr varies as a function of depth in the film. For example, a graded zirconium silicon-oxynitride film may be formed that is mainly $SiO_2$ at the substrate interface (e.g. 2–10 mol % Zr), thus providing an interface with a quality similar to that obtained with pure $SiO_2$. The ratio of silicon-to-metal is decreased with a grading profile that preferably results in a greater percentage of metal oxynitride near the top of the gate dielectric film. This approach may be preferred when a metal gate electrode will be formed on the gate dielectric.

Embodiment 1

In one embodiment according to the invention, a zirconium or hafnium silicon-oxynitride gate dielectric is formed by depositing Zr or Hf on a clean Si surface, annealing this structure to form a metal silicide, oxynitridating the silicide layer, and annealing this structure. In this embodiment, a substrate such as shown in either FIG. 3 or FIG. 4 is used. If surface 28 is passivated as shown in FIG. 4, the substrate can be briefly heated to above 500° C. in vacuum or an inert ambient to remove the passivation.

Figure 6:
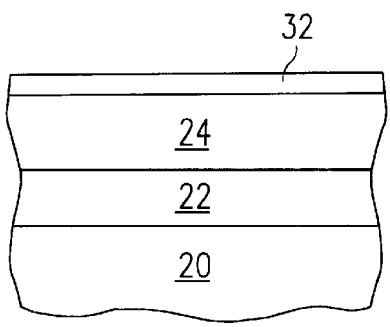
FIGS. 6–19 are cross-sectional views of a semiconductor device during fabrication according to various embodiments of the invention.

Referring to FIG. 6, a metal layer 32 (e.g. zirconium) is deposited directly on surface 28, e.g. by sputtering, evaporation, chemical vapor deposition (CVD) or plasma CVD. The figures show that surface 28 is the surface of channel region 24. However, formation of a metal silicon-oxynitride layer on the surface of epitaxial layer 22 or substrate 20 follows the same method. Layers 20 and 24 will be used interchangeably below, except where the context shows a distinction is meant.

Sputter deposition is preferably done with a low-energy plasma system, such as collimated or long-throw sputtering. Low deposition rates (e.g. on the order of a few angstroms per second) may be useful, as the total thickness to be deposited is small and uniformity is desired. For an 8" wafer, deposition may be completed in a system with a base pressure of $\sim 10^{-8}$ Torr, an operating pressure of $\sim 10^{-4}$ Torr, and a separation between the sputter gun and the wafer of 16 inches, and the wafer may be rotated to improve uniformity. Ar is an acceptable sputter gas, and the wafer may be maintained at a temperature of 400° C. during deposition.

As an alternative to sputtering, metal layer 32 may be deposited by evaporation from an e-beam source onto a substrate at 500° C., with a net deposition rate on the order of tenths of angstroms to a few angstroms per second. The substrate is preferably rotated to improve uniformity.

Other alternative methods include CVD or plasma CVD using appropriate precursors, such as zirconium tetrachloride (or hafnium tetrachloride) and hydrogen gas. Nitrogen-bearing zirconium (or hafnium) precursors, such as a Zr (or Hf) nitrate, would also be acceptable. Again, with these methods low deposition rates and temperatures (600° C. and lower) can be useful, and a downstream plasma type reactor is preferred to a reactor where the plasma is generated at the substrate.

Figure 7:
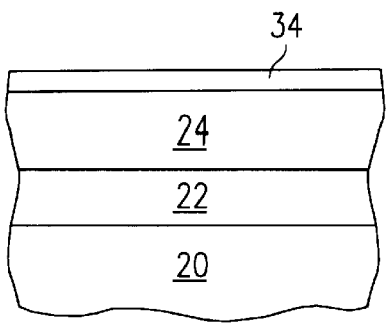

Referring to FIG. 7, a metal silicide layer 34 is formed by annealing substrate 20 with metal layer 32 in an inert ambient, a reducing ambient, or vacuum. Although exact values will depend on the metal selected and the thickness of silicide desired, a 20 second anneal at 700° C. in vacuum will generally suffice. During most silicide process, silicon from substrate 20 diffuses into metal layer 32 to form metal silicide layer 34. It should be noted that with this technique, an excessively thick metal layer 32 may be deposited, such that less than the entire layer 32 is converted to silicide during the anneal. In this case, the thickness of the silicide is controlled by the anneal time, and the excess metal is etched away after the silicide anneal step.

Figure 8:
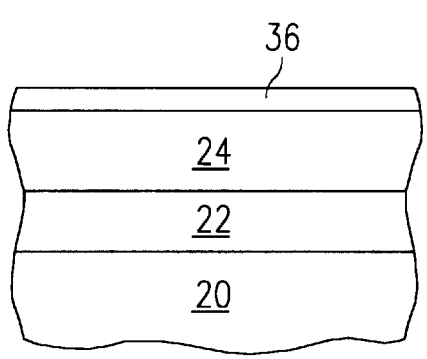

Referring now to FIG. 8, silicide layer 34 is converted to a zirconium (or hafnium) silicon-oxynitride layer 36 by oxynitridation. Process control is critical during this step, as under-oxynitridation will result in decreased resistivity and diffusion resistance and over-oxynitridation may result in decreased capacitance for layer 36 (due to oxidation of the underlying silicon). Several processes are available for this step. The silicide can be converted into zirconium (or hafnium) silicon-oxynitride by direct exposure to an oxygen/nitrogen atmosphere, such as NO or $N_2O$. Alternatively, a low temperature remote $N_2/O_2$ plasma can also be used.

One alternative to direct conversion in an oxynitride atmosphere is nitridation in a nitrogen ambient, such as a remote nitrogen plasma or $NH_3$, followed by oxidation. Many oxygen anneal processes are available for this step, such as a low temperature $O_2$ anneal with or without ultraviolet exposure, or an activated oxygen anneal such as $O_3$, $O_3$ with ultraviolet exposure, a downstream $O_2$ plasma, $N_2O$, or a low temperature $O_2$ plasma with a DC-biased substrate. As an example of this last process, a downstream 1500W ECR source operating at 1 mTorr, coupled with ~60V DC and 13.56 MHz or 300 kHz RF applied to the substrate may be used while He backside cooling at 80° C. is also applied to the substrate. Processing time is determined experimentally such that both resistivity and dielectric constant lie within an acceptable range.

Generally, a high temperature anneal of zirconium (or hafnium) silicon-oxynitride layer 36 is selected to densify or crystallize the film after low temperature oxynitridation. For example, the substrate may be densified by annealing in Ar for 20 seconds at 750° C. This anneal may be done in either an inert or a reducing environment, with a reducing environment particularly useful where metal layer 32 was deposited by CVD using halogens. If a reducing environment is used, an additional low-temperature post-anneal in oxygen may be used to improve dielectric properties of the metal silicon-oxynitride layer 36.

Figure 9:
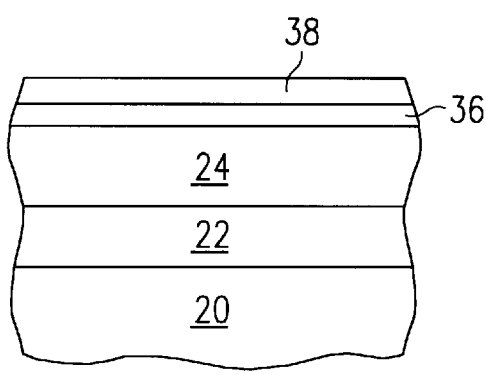

Finally, with reference to FIG. 9, conductive gate 38 is deposited over the zirconium silicon-oxynitride gate dielectric 36. Processes for depositing gate 38 are well known in the art; gate 38 may be formed, by way of example, of doped polysilicon, metal, or a conductive metal oxide.

In other approaches, polysilicon gates often require an additional passivation layer between dielectric 36 and gate 38 to prevent reduction of dielectric 36 and oxidation of gate 38 at the interface. Although a passivation layer is allowable, this zirconium (or hafnium) silicon-oxynitride dielectric approach largely minimizes this problem. If the Si content of the dielectric 36 to gate 38 interface is approximately the same as at the dielectric 36 to substrate 20 interface, then many of the compatibility benefits obtained at the bottom interface are also available at the top interface. Additionally, the nitrogen in the dielectric 36 will greatly reduce boron migration through the dielectric 36 to the substrate 20 when a polysilicon gate is doped.

Figure 2:
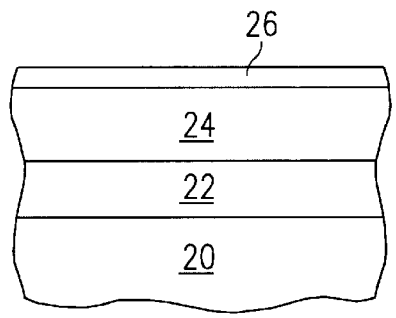
FIGS. 2–5 are cross-sectional views of several semiconductor devices, illustrating different surfaces appropriate for deposition of a zirconium silicon-oxynitride gate dielectric according to the invention.

As a variation on this embodiment, the silicide and oxynitridation steps may be combined, either by introducing an oxygen/nitrogen ambient before the silicide is completely formed, or by completely overlapping the two steps. In this latter variation, a substrate such as that depicted in FIG. 2 is acceptable, as silicon oxide layer 26 can supply both oxygen and silicon towards the formation of metal silicon-oxynitride layer 36.

We have found that the oxynitridation process is simplified if the silicide is not completely reduced. Thus, we sometimes prefer to replace the metal source for metal layer 32 with a metal oxide source, such as zirconium oxide. Then, upon annealing, layer 34 is an oxygen-deficient silicate. This reduced silicate is then processed using the same general approach as the metal silicide approach.

Embodiment 2

In another embodiment according to the invention, a zirconium or hafnium silicon-oxynitride gate dielectric is formed by depositing zirconium silicide or hafnium silicide on a clean Si surface, oxynitridating the silicide layer, and annealing this structure. In this embodiment, a substrate such as shown in either FIG. 3 or FIG. 4 is used. If surface 28 is passivated as shown in FIG. 4, the substrate can be briefly heated to above 500° C. in vacuum or an inert ambient to remove the passivation.

Referring to FIG. 7, a metal silicide layer 34 (e.g. zirconium silicide) is deposited directly on surface 28, e.g. by sputtering, evaporation, chemical vapor deposition (CVD) or plasma CVD.

Sputter deposition is preferably done with a low-energy plasma system, such as collimated or long-throw sputtering. Low deposition rates (e.g. on the order of a few angstroms per second) may be useful, as the total thickness to be deposited is small and uniformity is desired. For an 8" wafer, deposition may be completed in a system with a base pressure of ~$10^{-8}$ Torr, an operating pressure of ~$10^{-3}$ Torr, and a separation between the sputter gun and the wafer of 16 inches, and the wafer may be rotated to improve uniformity. Ar is an acceptable sputter gas, and the wafer may be maintained at a temperature of 400–600° C. during deposition.

As an alternative to sputtering, silicide layer 32 may be deposited by evaporation from an e-beam source onto a substrate at 500–600° C., with a net deposition rate on the order of tenths of angstroms to a few angstroms per second. The substrate is preferably rotated to improve uniformity. This evaporation method can use a single zirconium silicide evaporation source or can use separate Zr and Si sources. With separate sources, the Zr/Si ratio can be varied during deposition to provide a graded layer and more controlled Zr content.

When used with metal (non-polysilicon) gate conductors, this graded approach would allow the zirconium silicon-oxynitride to permit optimum interface formation. For example, the dielectric layer could be silicon rich near the substrate, thus providing a better match to the silicon. Conversely, the zirconium silicon-oxynitride will be Zr rich near the gate conductor, thus providing a higher dielectric constant. If this silicon-rich interface gradient is combined with a nitrogen-deficient gradient, then the silicon/dielectric interface can approximate a silicon/silicon dioxide interface and, therefore, be treated by conventional techniques (such as sinters in $H_2$ or $D_2$).

Other alternative methods include CVD or plasma CVD using appropriate precursors, such as zirconium tetrachloride (or hafnium tetrachloride) co-deposited with silane, disilane, or dichlorosilane and hydrogen gas. Again, with these methods low deposition rates and temperatures (600° C. and lower) can be useful, and a downstream plasma type reactor is preferred to a reactor where the plasma is generated at the substrate.

Referring now to FIG. 8, silicide layer 34 is converted to a zirconium (or hafnium) silicon-oxynitride layer 36 by oxynitridation. This oxynitridation process generally follows the same method described in the first embodiment. p As stated above, we have found that the oxynitridation process is simplified if the silicide is not completely reduced. Thus, we sometimes prefer to replace the source for silicide layer 34 with an oxygen-deficient metal silicate source, such as oxygen-deficient zirconium silicate.

When using the separate Zr (or Hf) and Si sources, the Zr can be replace by $ZrO_2$. In an alternate evaporation process, with a slightly lower oxygen content (at this stage), the Si can be replaced with $SiO_2$. This $SiO_2$ will evaporate as SiO, thus providing a small amount of oxygen.

Embodiment 3

In a third embodiment according to the invention, a zirconium (or hafnium) silicon-oxynitride gate dielectric is formed by depositing zirconium (or hafnium) on a substrate in an oxygen/nitrogen ambient, followed by annealing. This embodiment preferably utilizes a substrate prepared by one of the methods corresponding to FIGS. 2, 3, or 4, and the metal may be deposited by one of the methods described in embodiment 1, with the following differences.

Figure 10:
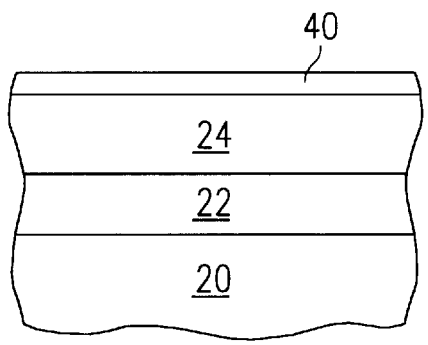

Referring to FIG. 10, an oxynitrided zirconium layer 40 may be deposited on a clean Si surface by sputtering a metal as described above. However, some amount of controlled oxygen and nitrogen activity is used to at least partially oxidize-nitridize layer 40 as zirconium is supplied to the substrate. For example, NO or $N_2O$ may be introduced near the substrate during sputtering with Ar, with a NO flow rate of about one-tenth that of the Ar flow rate. For a metal deposition rate of 0.1 nanometers per second, the oxynitridation gas is preferably introduced from 0 to 5 seconds after the start of the deposition process. This time delay will help prevent formation of an interfacial $SiO_2$ layer.

If the zirconium is introduced by the evaporation method, the oxynitridation gas is preferably added near the substrate. To achieve near complete oxynitridation of the deposited metal, ~5–10 Torr of NO may be used for a metal deposition rate of 0.1 nm/sec. If a CVD method is used, appropriate precursors should provide the necessary oxygen (e.g. zirconium tetrachloride and water), and may provide the nitrogen. For a non-nitrogen-bearing precursor, the nitrogen can be provided by a post-deposition nitridation with a nitrogen source such as a remote nitrogen plasma, NO, $N_2O$ or $NH_3$.

Figure 11:
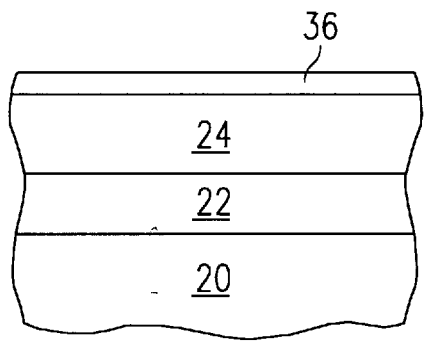

Referring to FIG. 11, layer 40 is reacted with the substrate to form zirconium (or hafnium) silicon-oxynitride layer 36. Preferably, this is accomplished with a low-temperature oxygen anneal followed by a high temperature anneal, such as those described in the preceding embodiment. Two examples of preferred oxygen anneals are a 400° C. anneal in $O_3$ for 60 seconds or a rapid thermal oxidation at 700 degrees C. for 10 seconds or less.

Figure 12:
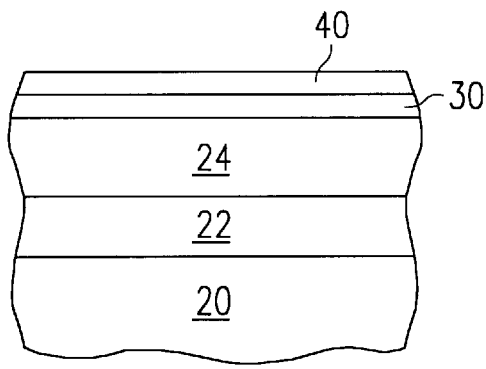

It should be noted that this embodiment may be readily tailored to produce a graded layer. One variation on this method is shown in FIG. 12, wherein layer 40 is deposited over a silicon oxynitride layer 30. In such an embodiment, oxygen/nitrogen activity during the anneal may be reduced, and zirconium silicon-oxynitride layer 36 may be formed by "stealing" oxygen, nitrogen, and silicon from layer 30. The grading of the structure may be adjusted by adjusting the relative initial thicknesses of layers 30 and 40. It may also be appropriate to supply Si to layer 40 by implantation of energetic ions from a remote plasma, using DC bias on the substrate to adjust penetration depth. For example, silane may be used to implant Si into layer 40.

Embodiment 4

In a fourth embodiment according to the invention, a zirconium (or hafnium) silicon-oxynitride gate dielectric is formed by depositing both metal and silicon on the substrate in an oxygen/nitrogen atmosphere, typically followed by annealing. In this embodiment, the substrate preparation may be chosen as any of those shown in FIGS. 2–5. As this method generally does not rely on silicon from the substrate as a component of the film, a surface that limits oxidation of the substrate, such as the diffusion barrier surface 30 of FIG. 5, could be used. Both oxynitride and nitride diffusion barriers seem to be compatible with a zirconium silicon-oxynitride dielectric layer. The metal and silicon may be deposited by one of the methods described in embodiment 2, with the following differences.

Figure 13:
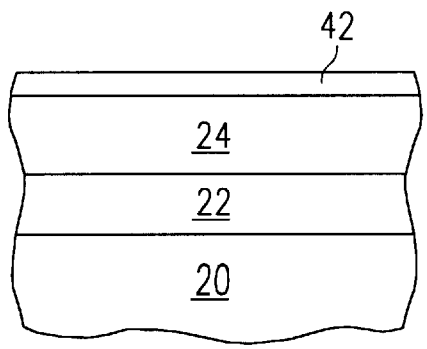

Referring to FIG. 13, an oxynitrided Zr and silicon layer 42 may be deposited on a clean Si surface by sputtering as described in embodiment 3 for the deposition of oxynitrided metal layer 40. The deposition of both zirconium (or hafnium) metal and silicon is accomplished by replacing the metal target with an appropriate silicide target. The disadvantage of this method is that deposition of a graded layer from a single composition target is difficult.

If oxynitrided metal and silicon layer 42 is produced by the evaporation method, a method similar to that of embodiment 2 may be selected. In this case, it is preferred that separate metal and silicon e-beam sources be used such that the ratio of silicon to metal may be varied during deposition.

If a CVD method is used, appropriate precursors should provide the necessary oxygen. Some combinations of precursors, such as a combination of silane, zirconium tetrachloride, oxygen, and NO, $N_2O$ or $NH_3$ may be used to produce uniform stoichiometry layers but may be difficult to use for a graded composition layers. For a graded layer, CVD precursors such as a combination of silicon tetrachloride, zirconium tetrachloride, water, and NO or $N_2O$ are preferred.

Figure 14:
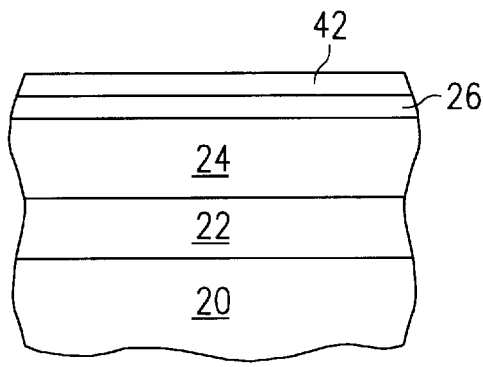
Figure 15:
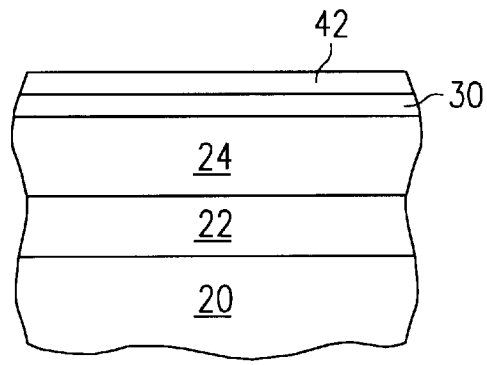

Formation of a high performance zirconium silicon-oxynitride layer using this process will generally require both a low-temperature oxygen anneal and a high temperature anneal such as those described in the preceding embodiments. FIGS. 14 and 15 depict, respectively, layer 42 deposited on a silicon oxide layer 26 and on a passivation layer 30 (e.g. a silicon oxynitride layer).

Embodiment 5

Figure 17:
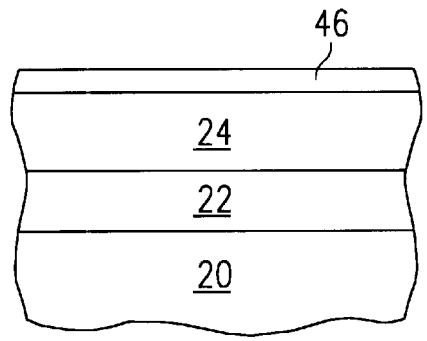
Figure 18:
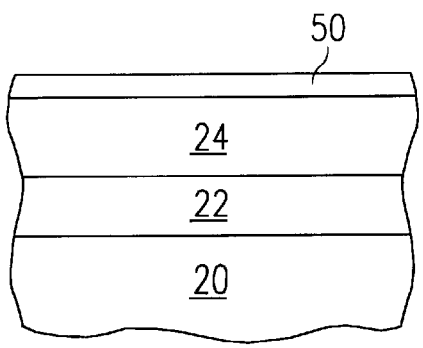
Figure 19:
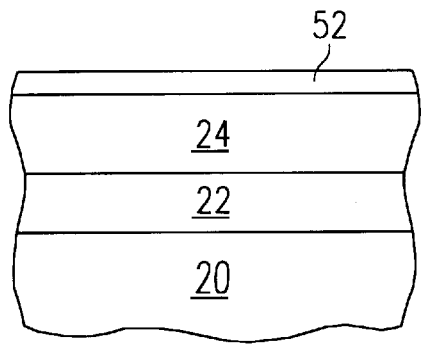

As an alternative to the preceding embodiments, it is recognized that some of the deposition steps described may be repeated to tailor the composition of a hafnium silicon-oxynitride layer structure. With reference to FIGS. 17 and 18, for example, layer 46 may form only an intermediate layer. For example, one or more monolayers of either silicon, zirconium, or a combination may be deposited using the e-beam evaporation method described in embodiment 4, followed by a short anneal in an oxygen/nitrogen ambient to produce intermediate layer 46. This may then be followed by deposition of a second intermediate layer 48 by a similar process, with the same or a different composition. Using this method, oxynitrided silicon and oxynitrided metal layers can be interleaved in an alternating fashion prior to a final anneal. Or, graded compositions can be deposited directly.

Embodiment 6

In a sixth embodiment of the invention, a zirconium or hafnium silicon-oxynitride gate dielectric is formed by a somewhat different approach. In this approach, a silicon dioxide layer on a substrate is converted to a zirconium (or hafnium) silicon-oxynitride layer by use of remote plasmas of Zr and N-bearing species, such as $N_2$, NO, $N_2O$, etc.

Figure 16:
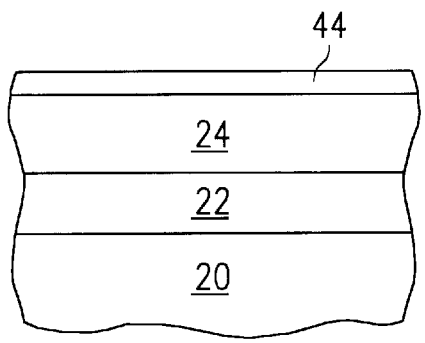

The description of this embodiments begins, as shown if FIG. 16, after formation of an optional epitaxial Si layer 22 on substrate 20 and implantation of an active channel region 24 in epitaxial layer 22 (or substrate 20, if no epi-layer is used), and assumes that a thermal, or less preferably, native silicon oxide region 44 overlies channel 24 in the region of interest. Processes for reaching this step in fabrication are all well-known in the art, as are various equivalents to which the present invention is applicable.

Referring to FIG. 17, the oxide layer 44 is converted to a zirconium (or hafnium) silicon-oxynitride layer 46 by exposing the oxide surface to plasmas of zirconium (or hafnium) and nitrogen.

For example, a downstream $N_2$ plasma, and a downstream Zr plasma can be used with a DC-biased substrate. Processing time is determined experimentally such that both resistivity and dielectric constant lie within an acceptable range.

Generally, a high temperature anneal of the zirconium silicon-oxynitride layer 46 is selected to densify the film after oxynitridation low temperature oxidation. For example, the substrate may be densified by annealing in Ar for 20 seconds at 750° C. This anneal may be done in either an inert or a reducing environment. If a reducing environment is used, an additional low-temperature post-anneal in oxygen may be used to improve dielectric properties of the metal silicon-oxynitride layer 46.

This disclosure has concentrated on gate dielectrics. However, if the leakage current is suitably low, most gate dielectrics can be used as storage dielectrics in a memory cell. It should be noted, that in general, memory dielectrics are not suitable for use as gate dielectrics. This unsuitability is due to the much more demanding interface characteristics that gate dielectrics usually require. With a zirconium (or hafnium) oxynitride dielectrics, the leakage currents can be reduced to acceptable levels by increasing the oxidation time (i.e., the oxygen content of the metal oxynitride). Although this increased oxygen content slightly decreases the permittivity of the overall structure, the overall dielectric constant is still significantly above current technologies. It should be noted that the physical vapor deposition (PVD) methods above (sputtering and evaporation) typically do not provide a highly conformal layer. Thus, when using one of these PVD methods above for storage dielectric applications, it may not be practical to use this on enhanced surface area geometries, such as rugged polysilicon. However, the high permittivity of zirconium (and hafnium) silicon-oxynitride allows artisans to manufacture useful, high energy storage, capacitors, without complex surface area enhancement schemes.

What is claimed is:

1. An integrated circuit having a field effect device fabricated thereon, the field effect device comprising:
   a single-crystal silicon semiconducting channel region;
   a metal silicon-oxynitride gate dielectric overlying the channel region
   where the metal is selected from the group of hafnium, zirconium, and mixtures thereof; and
   a conductive gate overlying the gate dielectric.

2. The integrated circuit of claim 1, wherein the gate dielectric is polycrystalline.

3. The integrated circuit of claim 1, wherein the gate dielectric is amorphous.

4. The integrated circuit of claim 1, wherein the metal silicon-oxynitride gate dielectric has a graded composition comprising a relatively greater ratio of silicon to metal near the semiconducting channel region, as compared to the ratio of silicon to metal near the conductive gate.

5. The integrated circuit of claim 1, wherein the single-crystal silicon semiconducting channel region is part of an epitaxial layer.

6. The integrated circuit of claim 1, wherein the single-crystal silicon semiconducting channel region is part of a silicon substrate.

7. The integrated circuit of claim 1, wherein the single-crystal silicon semiconducting channel region is part of a Si (100) substrate.

8. The integrated circuit of claim 1, wherein the conductive gate comprises polysilicon.

9. The integrated circuit of claim 1, wherein the metal is zirconium.

10. The integrated circuit of claim 1, wherein the metal is hafnium.

11. The integrated circuit of claim 4, wherein the single-crystal silicon semiconducting channel region is part of an epitaxial layer.

12. The integrated circuit of claim 4, wherein the single-crystal silicon semiconducting channel region is part of a silicon substrate.

13. The integrated circuit of claim 4, wherein the single-crystal silicon semiconducting channel region is part of a Si (100) substrate.

14. The integrated circuit of claim 4, wherein the conductive gate comprises polysilicon.

15. The integrated circuit of claim 4, wherein the metal is zirconium.

16. The integrated circuit of claim 4, wherein the metal is hafnium.

* * * * *